United States Patent [19]
Seidel

[11] Patent Number: 5,530,375
[45] Date of Patent: Jun. 25, 1996

[54] METHOD OF TESTING CIRCUITS AND/OR BURNING-IN CHIPS

[75] Inventor: Victor P. Seidel, Burlington, Vt.

[73] Assignee: International Business Machines Corporation, Armonk, N.Y.

[21] Appl. No.: 417,705

[22] Filed: Apr. 6, 1995

Related U.S. Application Data

[63] Continuation of Ser. No. 996,542, Dec. 24, 1992, abandoned.

[51] Int. Cl.⁶ .......................... G01R 1/073; G01R 31/02
[52] U.S. Cl. .................................... 324/761; 324/754
[58] Field of Search ................................ 324/754, 761, 324/72.5, 755

[56] References Cited

U.S. PATENT DOCUMENTS

| | | | |
|---|---|---|---|
| 902,753 | 11/1908 | Marshall | 324/72.5 |
| 3,148,356 | 9/1964 | Hedden, Jr. | 439/75 |
| 3,333,232 | 7/1967 | Patton, Jr. | 439/680 |
| 3,429,041 | 2/1969 | Patton, Jr. | 439/660 |
| 3,609,539 | 9/1971 | Gunthert | 324/72.5 |
| 3,885,215 | 5/1975 | Weinstock | 324/754 |
| 3,970,934 | 7/1976 | Aksu | 324/761 |
| 3,992,073 | 11/1976 | Buchoff et al. | 324/72.5 |
| 4,109,295 | 8/1978 | Rostek et al. | 361/782 |
| 4,109,296 | 8/1978 | Rostek et al. | 361/782 |
| 4,423,373 | 12/1983 | LeCroy, Jr. | 324/72.5 |
| 4,654,472 | 3/1987 | Goldfarb | 439/660 |
| 4,675,600 | 6/1987 | Gergin | 324/754 |
| 4,838,800 | 6/1989 | Lynch | 439/78 |
| 4,841,241 | 6/1989 | Hilz et al. | 324/761 |
| 4,871,964 | 10/1989 | Boli et al. | 324/158 P |
| 4,897,055 | 1/1990 | Jurista et al. | 438/931.1 |
| 4,997,376 | 3/1991 | Buck et al. | 439/660 |
| 5,071,363 | 12/1991 | Reylek et al. | 439/931 |

OTHER PUBLICATIONS

IBM Disclosure Bulletin, vol. 21, No. 11, Apr. 1979.

*Primary Examiner*—Ernest F. Karlsen
*Attorney, Agent, or Firm*—Calfee, Halter & Griswold

[57] ABSTRACT

According to the present invention an improved device and method for testing the integrity of electrical connectors on a substrate and/or for providing for burn-in of a semi-conductor on a substrate is provided. The test unit includes a mounting fixture having a plurality of pins carried thereon preferably spring loaded. At least some of the pins are provided with a plurality of circumferentially spaced conducting members which are electrically insulated from each other. These pins are configured and mounted on the fixture to move into and out of engagement with a portion at least two and preferably four adjacent connectors on the substrate thereby allowing a single pin to contact up to four or more contacts on the substrate. In addition to the single pin contacting four or more connectors, the pins are configured such that they fit between the connectors rather than resting on top of them with the electrically conducting members contacting the sides of the solder balls thereby providing a extended contact surface as opposed to contacting the tops of the connectors on the substrate. Each of the separate conducting members on the pins is connected to a test circuit and/or a burn-in circuit which provides the appropriate test signals and/or power to the various connectors on the substrate.

8 Claims, 2 Drawing Sheets

METHOD OF TESTING CIRCUITS AND/OR BURNING-IN CHIPS

This is a continuation of application Ser. No. 07/996,542 filed on Dec. 24, 1992, now abandoned.

FIELD OF THE INVENTION

This invention relates generally to testing of electrical connections on a substrate for electrical continuity and circuit functions and/or burning-in semi-conductor chips on a substrate, and more particularly to the testing of solder ball type connections and burning-in chips connected thereto on a substrate and which solder balls are arranged in a rectilinear pattern.

BACKGROUND ART

There are many different techniques for forming electrical connections on or to substrates and/or burning-in semi-conductor chips mounted on a substrate. One technique utilizes so-called solder balls or solder-pads arranged in a predetermined pattern on a substrate which solder balls in turn are electrically connected to chips or other substrates to form the necessary circuitry. It is desirable, if not necessary, to test the electrical connections or the electrical integrity of these solder balls and their associated circuitry before final assembly of the product to thereby determine if in fact there is any deficient or defective connections. These can either be repaired or if repair is not feasible, the part can be scrapped before any further work is done thereby minimizing any losses. Testing of these solder ball connections has taken various forms. One form is to provide a test fixture having an array of probes either in the form of spring loaded pins or in the form of buckling beams which pins or beams are arrayed in the configuration of the solder balls on the substrate. The pins or beams are supported in a fixture which moves them into and out of contact with the solder balls, and the necessary tests or burn-in procedures can be performed with a pin or beam contacting each solder ball.

This type of test or burn-in connection has several drawbacks and limitations. One of these limitations is that the probe contact is with the highest point on the solder ball. Since this is point-to-point contact with a round portion of the ball, it is sometimes difficult to make good contact thus resulting in occasional false readings or improper burn-in. Additionally, as the spacing between the solder balls becomes closer and closer due to advancing technology, it becomes more and more difficult to provide for pins which are physically arranged and supported and properly mounted within such close confines thereby making testing more difficult. Additionally with the decreasing distance between the solder balls there is an increase in the density of the solder balls on a given surface area thus necessitating a significant increase in the density of the pins for testing; this can increase significantly the cost of test fixtures and increase the possibility of failures due to the increase in number of pins required.

SUMMARY OF THE INVENTION

According to the present invention an improved device and method for testing the integrity of electrical connectors on a substrate and/or for providing for burn-in of a semi-conductor on a substrate is provided. The test unit includes a mounting fixture having a plurality of pins carried thereon preferably spring loaded. At least some of the pins are provided with a plurality of circumferentially spaced conducting members which are electrically insulated from each other. These pins are configured and mounted on the fixture to move into and out of engagement with a portion of at least two and preferably four adjacent connectors on the substrate thereby allowing a single pin to contact up to four or more electrical connectors on the substrate. In addition to the single pin contacting four or more connectors, the pins are configured such that they fit between the connectors rather than resting on top of them and are also of sufficient size so that the electrically conducting members contact the sides of the connector thereby providing an extended contact surface as opposed to contacting the tops of the connectors on the substrate. Each of the separate conducting members on the pins is connected to a test circuit and/or a burn-in circuit which provides the appropriate test signals and/or power to the various connectors on the substrate.

DESCRIPTION OF THE PREFERRED EMBODIMENT

Figure 1:
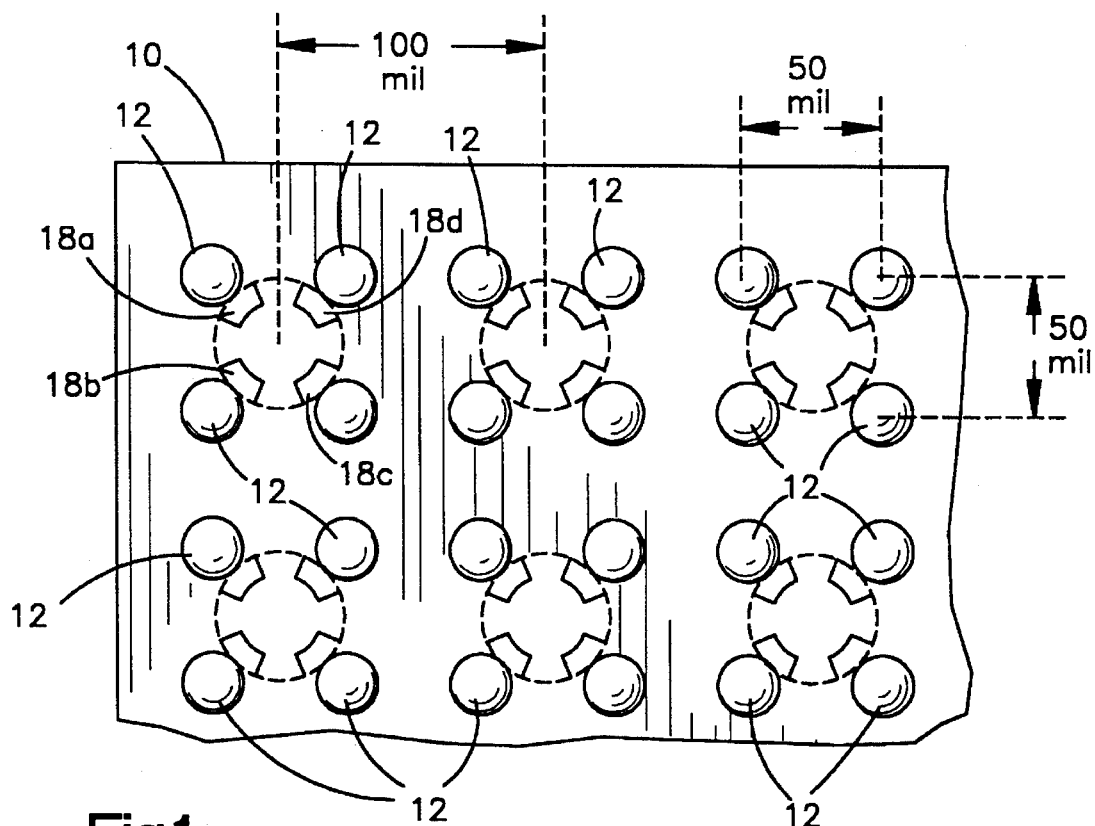
FIG. 1 is a plan view showing a portion of a substrate having conductors in the form of solder balls disposed thereon with semi-conductor chips mounted on the opposite side.
Figure 2:
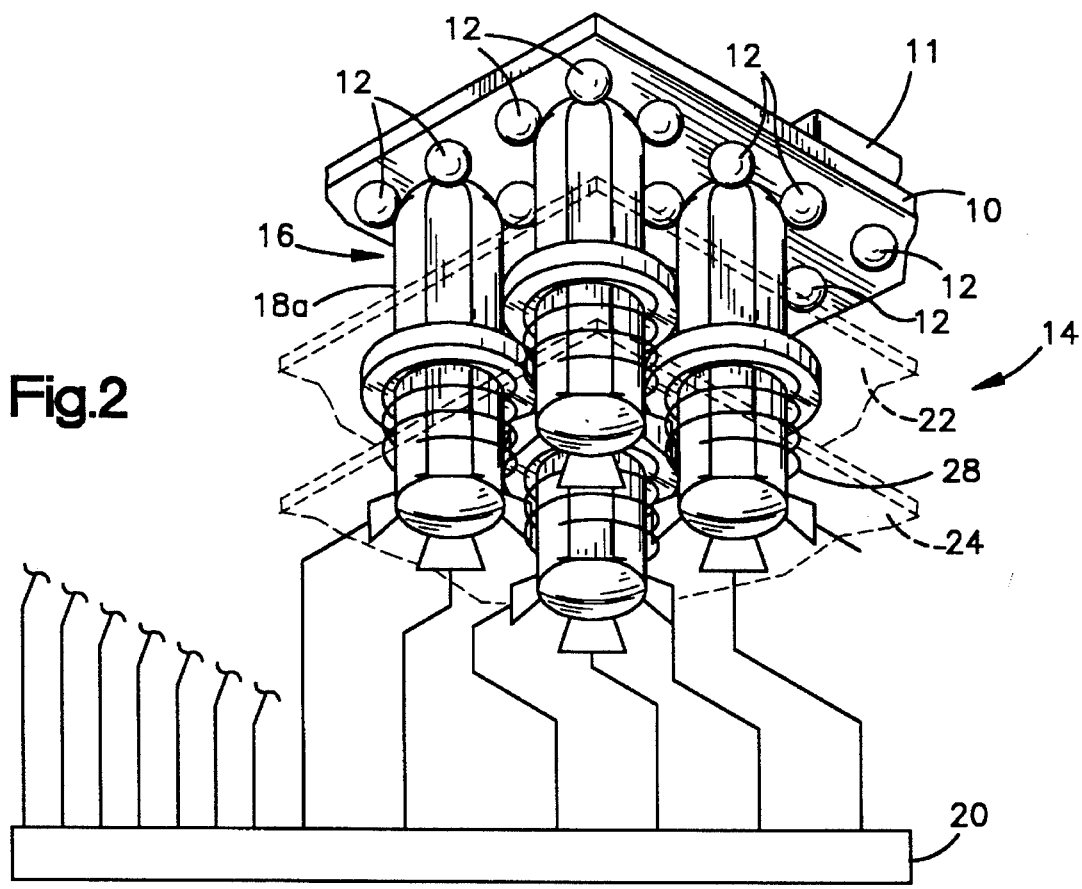
FIG. 2 is a perspective view somewhat diagrammatic of a portion of the test fixture showing the arrangement of the test pins according to this invention in position to be utilized to test the solder connections on the substrate.

Referring now to the drawing and for the present to FIGS. 1 and 2, a ceramic substrate 10 is shown which is the type used to mount semi-conductor chips 11 which are shown mounted on one surface thereof. The substrate 10 has a plurality of solder balls 12 disposed on the other surface thereof which are connected by surface and internal circuitry (not shown) to the chips 11 which together constitutes the structure to be tested and/or the chips 11 burned in. This type of chip and chip mounting structure is well known in the art.

The test apparatus for circuit testing and/or chip burn-in includes a mounting fixture shown diagrammatically at 14 which mounts a plurality of pins 16 thereon. Each of the pins 16 has four electrically conducting strips 18a, 18b, 18c and 18d which are circumferentially spaced therearound, and are electrically insulated from each other. To this end, the pins 16 are made of a non-conducting material such as polyetherimide, sold by General Electric Plastics under the designation Ultem (trademark). Thus, each of the conducting strips can be used independently for test and/or burn-in signals and power. The conducting strips 18a, 18b, 18c, and 18d are each connected to a test circuit designated generally at 20 which provides the necessary test and/or burn-in signals and power to these strips and thus to the solder balls 12 for testing and/or burn-in of the chips 11. This type of testing and/or chip burn-in circuit is well known in the art.

Figures 4, 5:
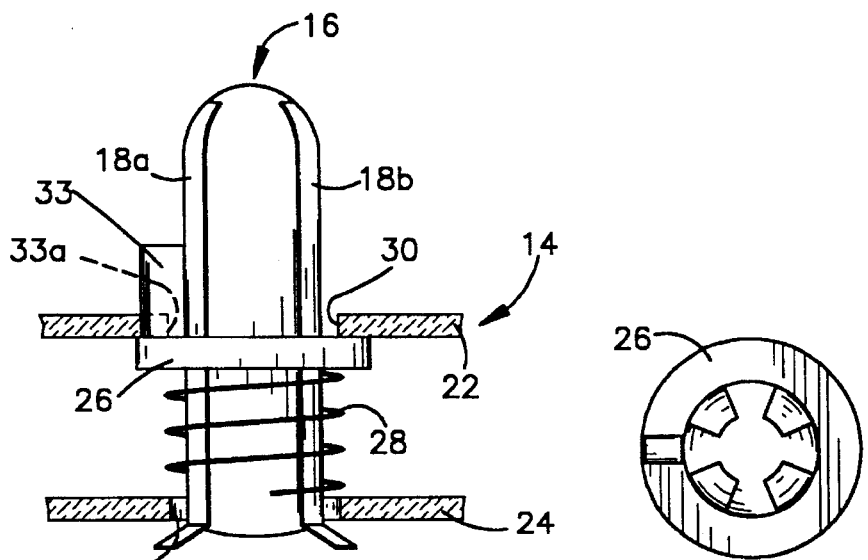
FIG. 4 is a detail view of the mounting of one of the pins on a fixture.
FIG. 5 is a top plan view of one of the pins.

As can best be seen in FIG. 4 each of the pins is mounted in the mounting fixture 14 which comprises an upper plate 22 and a lower plate 24. Each pin 16 has a collar 26 formed thereon and an electrically insulated spring 28 surrounding the pin. Openings 30 and 32 are provided in the plates 22 and 24 respectively to thereby provide a yieldably mounted spring loaded pin. Openings 30 and 32 are significantly larger than the pin 16 which allows the pins to be self-aligning as will be described presently. Additionally, each of the collars 26 has a key 33 formed thereon. The keys 33 ride in keyways 33*a* formed in the upper plate 22 at openings 30. Enough tolerance is provided in the keyways 33*a* to allow for the self-aligning feature of the pins 16.

Figure 3:
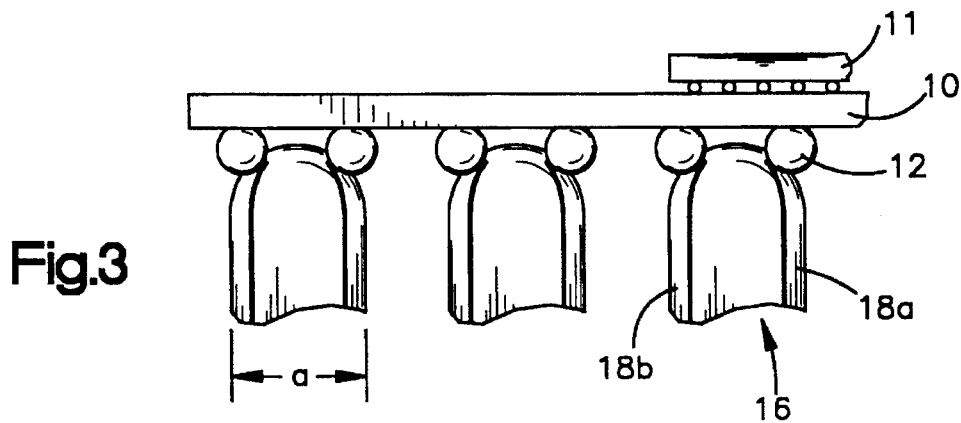
FIG. 3 is a longitudinal sectional view of a portion of the circuit board showing the pins in contact with the solder balls for testing.

In the described embodiment, the solder balls 12 are spaced on fifty mil centers both in rows and in columns as shown in FIG. 1. For testing of a package with the solder balls on 50 mil centers, the pins 16 are arrayed in the mounting fixture 14 on one hundred mil centers both in the rows and the columns, the center of each of the pins 16 being disposed centrally at the locus of the centers of four of the solder balls 12 all as shown in FIG. 1. Thus, when the pins 16 are brought into contact with the solder balls 12, as shown FIG. 3, each one of the conducting strips 18*a*, 18*b*, 18*c* and 18*d* will contact one of the solder balls 12 as shown in FIG. 1. The size of the pins is sufficiently large (i.e. the diameter of each pin 16 must be larger than the distance between diagonally opposite solder balls in each four solder ball array as shown in FIGS. 1 and 3). Hence as the fixture is moved (by means not shown) in and out of contact with the solder balls 16, when the pins are in contact with the solder balls they will be spring loaded urging them into engagement with the solder balls to form good electrical contact between each solder ball and its associated conducting strip, with each pin thereby connecting four different solder balls. In this position, the required electrical tests and/or chip burn-in can be performed on the electrical connections and/or chips. (The apparatus for and mounting of these types of bit fixtures are well known in the art and are not shown in detail.)

It will be apparent that with this invention a single pin can be used to test four different solder connections and/or burn-in chips on a substrate thereby reducing by ¼ the number of pins that are required as compared to conventional testing wherein a separate pin or buckling beam is utilized for testing each solder ball. Also, it will be recognized that from an examination of FIG. 3 that there is a significant area of extended contact surface between the conducting strips and the solder balls since the pin fits down between four solder balls thereby increasing the amount of contact surface area between the conducting strips 18 and the solder balls 12. It will also be noticed that the pins are tapered and rounded at their distal ends so that they can insert freely between the solder balls and, because of the spring loading and the enlarged openings 30 and 32, the pins are essentially self-aligning with respect to the solder balls. Hence, precise alignment is not necessary; as long as the alignment is approximate, the pin will align itself. This also compensates for variations in solder ball spacings. Thus, contact on all four solder balls with an extended contact surface is provided as well as a greatly reduced number of pins necessary to perform the necessary tests and/or burn in functions.

Figure 6:
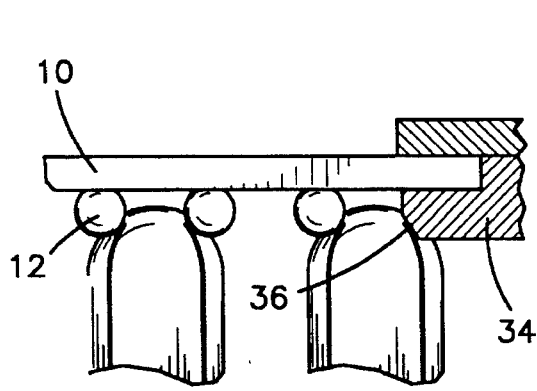
FIG. 6 is a longitudinal sectional view of an edge portion of a substrate showing a pin guide.

If there is an odd number of solder balls in a row or column, a single line of solder balls are adjacent an edge surface as shown in FIG. 6. In such a case, a guide number 34 is provided having rounded surfaces 36 which engages the substrate 10 with the rounded surfaces acting as a guide to assure proper engagement of the pins 16 with the adjacent solder ball 12. These pins will contact only two solder balls each instead of four as the other pins do; or in the case of an odd number of rows and columns, the corner pins 16 will contact only one solder ball.

Figures 7, 8:
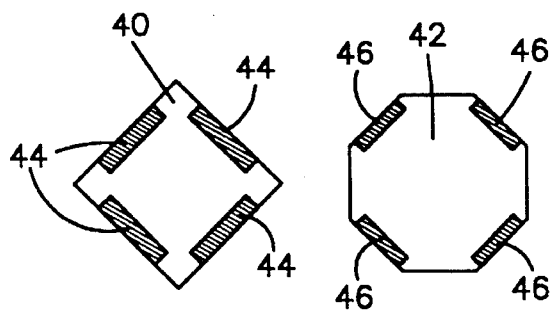
FIGS. 7 and 8 show other configurations of the pins.

Referring now to FIGS. 7 and 8, alternative shapes of pins are shown. FIG. 7 shows a square pin 40 and FIG. 8 shows an octagonal pin 42. In the case of the square pin, conducting strips 44 are located in the middle of each of the faces and in the octagonal pin, conducting strips 46 each constitute essentially one face thereof. With both of these configurations, and with openings in the plates 22 and 24 shaped to match with the shape of these strips, no twisting of the pins will be encountered.

Although several embodiments of this invention have been shown and described, various adaptations and modifications can be made without departing from the scope of the invention as defined in the appended claims.

What is claimed is:

1. A method for testing and/or providing chip burn-in signals and power to an array of regularly spaced individual raised electrical contacts on the surface of a substrate comprising the steps of:

providing a mounting fixture having a plurality of pins carried thereby, providing at least one of said pins with a plurality of circumferentially spaced conducting members electrically insulated from each other, said at least one pin being configured and mounted on said fixture to move into and out of engagement with portions of at least two of said electrical contacts upon movement of the fixture and substrate with respect to each other, moving said fixture and said substrate with respect to each other to bring said pins into engagement with said at least two electrical contacts, performing a test and/or burn-in function by providing electrical signals from each of said conducting members on each of said pins to said electrical contacts independently to perform test or burn-in functions independently through each of said contacts and independent of any other conducting member, and thereafter moving said fixture and said substrate with respect to each other to move said pins out of impact with said electrical contacts.

2. The invention as described in claim 1 further characterized by:

providing some of said pins with four electrical members which are configured and mounted to engage at least four of said electrical contacts.

3. The invention as described in claim 1 further characterized by providing openings in said fixture with said pins being slidably mounted in said openings and having biasing devices engaging said pins urging them toward said substrate.

4. The invention as described in claim 2 wherein the contacts and the pins are both arranged in a rectilinear pattern.

5. The invention as described in claim 4 wherein the spacing of the centers of the pins is about twice that of the spacings of the centers of the contacts.

6. The invention as defined in claim 1 further characterized by providing mounting of said pins for movement to align the pins with said contacts.

7. The invention as defined in claim 3, wherein said openings are larger than the pins to provide self alignment of the pins with the contacts on the substrate.

8. The method of claim 1 further characterized by providing a plurality of said pins with said circumferentially spaced conducting members, and arranged to contact a plurality of different contacts.

* * * * *